US011102917B2

(12) United States Patent
Kvarnstrand

(10) Patent No.: US 11,102,917 B2
(45) Date of Patent: Aug. 24, 2021

(54) CASING FOR HOUSING ELECTRONIC COMPONENTS

(71) Applicant: PREH GMBH, Bad Neustadt a. d. Saale (DE)

(72) Inventor: Laura Kvarnstrand, Habo (SE)

(73) Assignee: PREH GMBH, Bad Neustadt A.D. Saale (DE)

( * ) Notice: Subject to any disclaimer, the term of this patent is extended or adjusted under 35 U.S.C. 154(b) by 0 days.

(21) Appl. No.: 16/495,226

(22) PCT Filed: May 10, 2017

(86) PCT No.: PCT/EP2017/061235
§ 371 (c)(1),
(2) Date: Sep. 18, 2019

(87) PCT Pub. No.: WO2018/206106
PCT Pub. Date: Nov. 15, 2018

(65) Prior Publication Data
US 2020/0229326 A1    Jul. 16, 2020

(51) Int. Cl.
*H05K 7/20* (2006.01)
*H02K 11/33* (2016.01)
*H05K 5/02* (2006.01)

(52) U.S. Cl.
CPC ......... *H05K 7/20927* (2013.01); *H02K 11/33* (2016.01); *H05K 5/02* (2013.01); *H05K 7/20218* (2013.01)

(58) Field of Classification Search
CPC ................................................. H05K 7/20927
See application file for complete search history.

(56) References Cited

U.S. PATENT DOCUMENTS

| 5,773,755 A | 6/1998 | Iwatare |
| 2006/0152912 A1* | 7/2006 | Karrer ................ H05K 7/20927 361/790 |

(Continued)

FOREIGN PATENT DOCUMENTS

| CN | 106464153 A | 2/2017 |
| DE | 3026881 A1 | 2/1982 |
| DE | 112015002495 | 3/2017 |

OTHER PUBLICATIONS

The International Search Report and the Written Opinion of the International Searching Authority for PCT/EP2017/061235 dated Feb. 6, 2018, ISA, EPO, Rijswijk, The Netherlands.

(Continued)

*Primary Examiner* — Mukundbhai G Patel
(74) *Attorney, Agent, or Firm* — M&B IP Analysts, LLC

(57) ABSTRACT

The disclosed embodiments are directed to a casing for housing electronic components, comprising a casing wall structure surrounding a casing interior region for accommodating the electronic components, the casing wall structure defining a fluid flow passageway for thermal regulation fluid, the fluid flow passageway extending within the casing wall structure separated from said casing interior region from an inlet to and an outlet at the casing wall structure, characterized in that the casing wall structure completely encloses the casing interior region to make it a closed interior volume, and that the casing wall structure is double-walled by including an inner shell and an outer shell which form a space in between in communication with the inlet and the outlet such that between the inner and outer shells the fluid flow passageway is defined as a continuous and coherent flow space which completely encloses the interior volume of the casing wall structure.

12 Claims, 4 Drawing Sheets

(56) References Cited

U.S. PATENT DOCUMENTS

| | | | |
|---|---|---|---|
| 2007/0297142 A1* | 12/2007 | Hsu | H05K 7/20009 361/714 |
| 2010/0051450 A1* | 3/2010 | Murahara | C02F 9/00 204/240 |
| 2014/0198449 A1* | 7/2014 | Osada | H01L 24/40 361/689 |
| 2015/0373882 A1* | 12/2015 | Smith | H05K 7/20809 361/679.46 |

OTHER PUBLICATIONS

The First Office Action for Chinese Patent Application No. 2017800885473, dated Mar. 10, 2020, CNIPA, China.

* cited by examiner

CASING FOR HOUSING ELECTRONIC COMPONENTS

This application claims priority under 35 U.S.C. § 371 to the International Application No. PCT/EP2017/061235, filed May 10, 2017, now pending, the contents of which are hereby incorporated by reference.

TECHNICAL FIELD

The disclosed embodiments relate to a casing wall structure surrounding a casing interior region for accommodating electronic components, the casing wall structure defining a fluid flow passageway for thermal regulation fluid, the fluid flow passageway extending within the casing wall structure separated from said casing interior region from an inlet to and an outlet at the casing wall structure.

BACKGROUND

Examples of assemblies of electronic components are power electronic assemblies which find application in the automotive industry, for example as battery chargers. In particular in hybrid vehicles which use an electric motor in addition to a conventional combustion engine, power electronics assemblies are utilized for converting mechanical energy produced when the vehicle is decelerating to electrical energy, and for charging batteries with the electrical energy generated.

Power electronics assemblies utilize, among other electric circuit elements, solid-state electronic circuit components for control and conversion of electric power. In state of the art power electronic assemblies, power conversion is performed by semiconductor components such as diodes, thyristors, triacs and transistors. A typical power electronics device is an AC/DC converter (rectifier). Compared to electronic devices for transmission and processing of electronic signals and data, power electronics devices process substantially higher amounts of electrical energy. As a consequence the semiconductor components utilized for converting and handling high amounts of electrical energy generate substantial amounts of heat, and therefore need to be cooled in order to avoid damages or failure of the components. For this purpose, it is known to mount semiconductor components in casings which are in thermal contact with a cooling pipe through which a cooling fluid is flowing to dissipate heat from the semiconductor components.

An example for an automotive power electronic assembly is the E-Power Onboard Charger of the applicant, which comprises a cover plate of casted metal. On a first surface of the cover plate grooves are formed, and a generally U-shaped cooling tube is press fitted in the grooves of the cover plate. Inlet and outlet of the U-shaped cooling pipe project from one of the side edges of the cover plate to be connected to a cooling fluid circuit. On the second surface of the cover plate opposite to the first surface there are mounting structures for electrical components of the power electronics assembly. There are heat sink bodies in heat conducting contact with the second surface of the cover plate and with the electronic components to be cooled. The cover plate and a second housing part covering the second surface form the casing wall structure surrounding a casing interior region containing the electronic components. The cooling tube extending in the groove of the cover plate does not establish an efficient and extensive heat exchange contact. In addition, many mechanical working and assembly steps are needed to manufacture the casing.

US 2005/0007736 A1 discloses a casing for housing electronic components according to the preamble of claim 1. The casing comprises a casing wall structure of essentially cylindrical shape with open end faces. The casing wall structure surrounds a casing interior region, and the electronic components are mounted on the inner surface of the casing wall structure in the casing interior region. The casing wall structure defines a fluid flow passageway for thermal regulation fluid, the fluid flow passageway extending within the casing wall structure separated from the casing interior region for heat exchange with the electronic components mounted on the inner surface of the casing wall structure in the casing interior region. The fluid flow passageway is defined as a plurality of flow channels extending within the wall structure, separated from the casing interior region, along the axial direction of the cylindrical wall structure. Due to the open-end faces of the casing, the electronic components inside the casing are exposed to the ambient atmosphere, and are therefore exposed to variations of the ambient atmosphere regarding air temperature and humidity. In addition, the individual fluid flow channels forming the fluid flow passageway do not provide for an efficient and extensive heat exchanging relationship with the electronic components.

In most cases, the thermal regulation fluid will be utilized as a cooling fluid to transport heat away from the electronic components. However, there may also be applications in which a stable, predetermined temperature of the electronic components in the casing is to be maintained. In this case there may also be situations in which the thermal regulation fluid has a predetermined temperature above the temperature of some or all of the electronic components.

SUMMARY

It is an object of the disclosed embodiments to provide a casing for housing electronic components which achieves highly efficient temperature control of electronic components contained in the casing interior region by heat exchange contact with thermal regulation fluid flowing within the casing wall structure.

This object is achieved by the casing for housing electronic components comprising the features of claim 1. Preferred embodiments of the disclosure are set out in the dependent claims.

According to the disclosed embodiments, the casing wall structure completely encloses the casing interior region to make it a closed interior volume. Furthermore, the casing wall structure is double-walled and includes an inner shell and a surrounding outer shell of larger dimensions than the inner shell such that the inner shell and the outer shell form a space in between which is in communication with the inlet and the outlet. In this manner, this space between the inner and outer shells defines the fluid flow passageway as a continuous and coherent flow space, which continuous and coherent flow space completely encloses the interior volume of the casing wall structure. In other words, the interior volume of the casing is completely enveloped by the flow space between the outer and inner shells and therefore enclosed by a closed layer or bubble of flowing thermal regulation fluid. The definition that the continuous and coherent flow space completely encloses the inner shell and the interior volume therein is not meant to exclude that there may be individual spacers and/or bafflers extending between the inner and outer shells to keep the inner shell at a defined position within the outer shell with predetermined distances between the inner and outer shells and to guide flow. The distance between the inner shell and the outer shell does not have to be uniform, but has to be larger than zero at all positions (with the exception of eventual spacers) of the outer surface of the inner shell such that the flow space completely encloses the inner shell. There may also be passages in the casing wall structure for receiving electric cables leading to the interior volume and to the electric components therein.

The feature that the flow space completely encloses the interior volume of the casing as a continuous and coherent flow space is intended to mean that for any location inside the interior volume one will look, in every direction of view, at an interior wall which has an opposite back side in contact with thermal regulation fluid flow.

With this design, the heat exchange interface area between the thermal regulation fluid and the interior volume of the casing is maximized. The electronic components contained in the interior volume of the casing may be in contact with the inner wall of the inner shell, to be in close heat exchanging contact with the adjacent thermal regulation fluid flow on the opposite surface side of the inner shell.

It will be appreciated that the casing of the disclosed embodiments may be designed to be composed of very few parts and made of metal and/or plastics. Therefore, the design of the casing according to the disclosed embodiments also allows for a simple and efficient manufacturing and assembly process. In this connection it will also be appreciated that the double-walled casing wall structure has to be composed of at least two parts, for example a main casing part and a lid which are connected to each other, for example by welding, after the electronic components have been mounted in the interior volume of the casing.

It will also be appreciated that the casing wall structure which completely encloses the casing interior region permits to design the casing to be air-tight, i.e. the enclosed interior volume of the casing does not communicate with the ambient atmosphere. Such design is advantageous in applications where the casing is mounted in harsh environmental conditions, as for example in a motor compartment of a car. For an air-tight casing any passages for electric cables extending into the interior volume are sealed.

In a preferred embodiment, the casing wall structure has a tubular shape with closed end faces. According to this preferred embodiment, the inlet is located at one end face and is in communication with an inner conduit extending through the interior volume of the tubular casing wall structure to an inner wall of the opposite end face where it merges into the remaining flow space between the inner and outer shells. The outlet is disposed on the same end face as the inlet so that thermal regulation fluid injected through the inlet passes through the inner conduit to the opposite end face and is returned through the space between the inner and outer shell of the tubular casing wall structure to the outlet to exit the outlet on the same end face where it entered the inlet. In this embodiment, the inner conduit forms part of the flow space. This design is advantageous because the continuous flow space on the outside is supplemented by the inner conduit extending in the interior volume of the casing. In addition, it is advantageous that inlet and outlet are located on the same end face of the casing which simplifies mounting and assembly since access to the casing for connecting inlet and outlet is needed on one end face of the casing only.

The tubular shaped casing wall structure may have a circular, oval, triangular, rectangular, square or other polygonal cross-sectional shape.

In a preferred embodiment, there is at least one further shell inside or outside the inner and outer shells, wherein the further shell defines a further coherent and continuous flow space inside of the inner or outside of the outer shell, wherein this further flow space likewise completely encloses the interior volume of the casing wall structure. In other words, there may be more than one layer of thermal regulation fluid flow enclosing the interior volume of the casing.

In a preferred embodiment, the further flow space is provided with a further inlet and a further outlet separate from the inlet and the outlet. This allows to supply thermal regulation fluids with different temperatures to provide a desired temperature gradient along the flow space and the further flow space around the interior volume of the casing.

In a preferred embodiment, the inner conduit branches out in the interior volume into two or more inner conduits which merge again before merging into the remaining flow space of the casing wall structure or which individually merge into the remaining flow space of the casing wall structure. This embodiment allows for a more flexible design to provide for thermal regulation fluid flow through inner conduits at desired locations in the interior volume of the casing.

In a preferred embodiment, the inner conduit is provided with an expanded bulge portion which surrounds a closed inner conduit shell which encloses a conduit shell interior volume which is completely enclosed by continuous and coherent flow space defined between the expanded bulge portion and the inner conduit shell. This design allows to provide further separate interior volume portions each surrounded in addition to the flow space of the casing wall structure by an individual further flow space between the expanded bulge portion of the inner conduit and the inner conduit shell.

In a preferred embodiment, at least one printed circuit board is mounted in the interior volume of the casing wall structure, wherein the printed circuit board is arranged such that electronic components mounted thereon are disposed in the vicinity of the inner most shell bordering the interior volume or in the vicinity of the inner conduit.

In a preferred embodiment, the casing wall structure comprises at least two casing wall structure components that are connected to each other and which enclose the interior volume of the casing in an air-tight manner. As already mentioned, such design may be advantageous for applications in which casings are to be mounted at locations exposed to harsh environmental conditions.

In a preferred embodiment, the casing wall structure is composed of several casing wall structure components made of plastics, metal or composites or any combination thereof. The casing wall structure components may be connected by welding, additive manufacturing, electrostatic adhesion, by adhesives, or by inmolding or overmolding.

In a preferred embodiment, the casing wall structure components are made of thermally conductive plastics having a thermal conductivity of at least 1 W/mK. The thermally conductive plastics can be thermally conductive polypropylene, thermally conductive polyphthalamide, thermally conductive polycarbonate, thermally conductive polyphenylene sulfide, or thermally conductive polyether ether ketone. There are sophisticated thermally conductive polymers that have thermal conductivities of the order of 10 W/mK.

In a preferred embodiment, the inlet and the outlet form a concentric arrangement with a central port forming one of the inlet and outlet and a surrounding annular port forming the other end segment of the inlet and the outlet.

In a preferred embodiment the casing wall structure comprises a passage extending therethrough for receiving electric cables leading to the interior volume for connection to the electronic components therein.

In a preferred embodiment at least one baffler or spacer is provided which connects the inner and the outer shell of the casing wall structure. This improves the structural integrity of the casing. Bafflers may in addition be provided to achieve a desired flow pattern in the flow space.

In a preferred embodiment the casing wall structure is configured to provide electromagnetic shielding for the interior volume enclosed therein. This may be achieved by the material of the casing wall structure, its geometry or material additives contained in the flow space, which additives have electromagnetic shielding properties. The material additives may be added to the thermal regulation fluid.

BRIEF DESCRIPTION OF THE DRAWINGS

The disclosed embodiments will now be described with reference to an embodiment shown in the drawings in which.

DETAILED DESCRIPTION

Figure 1:
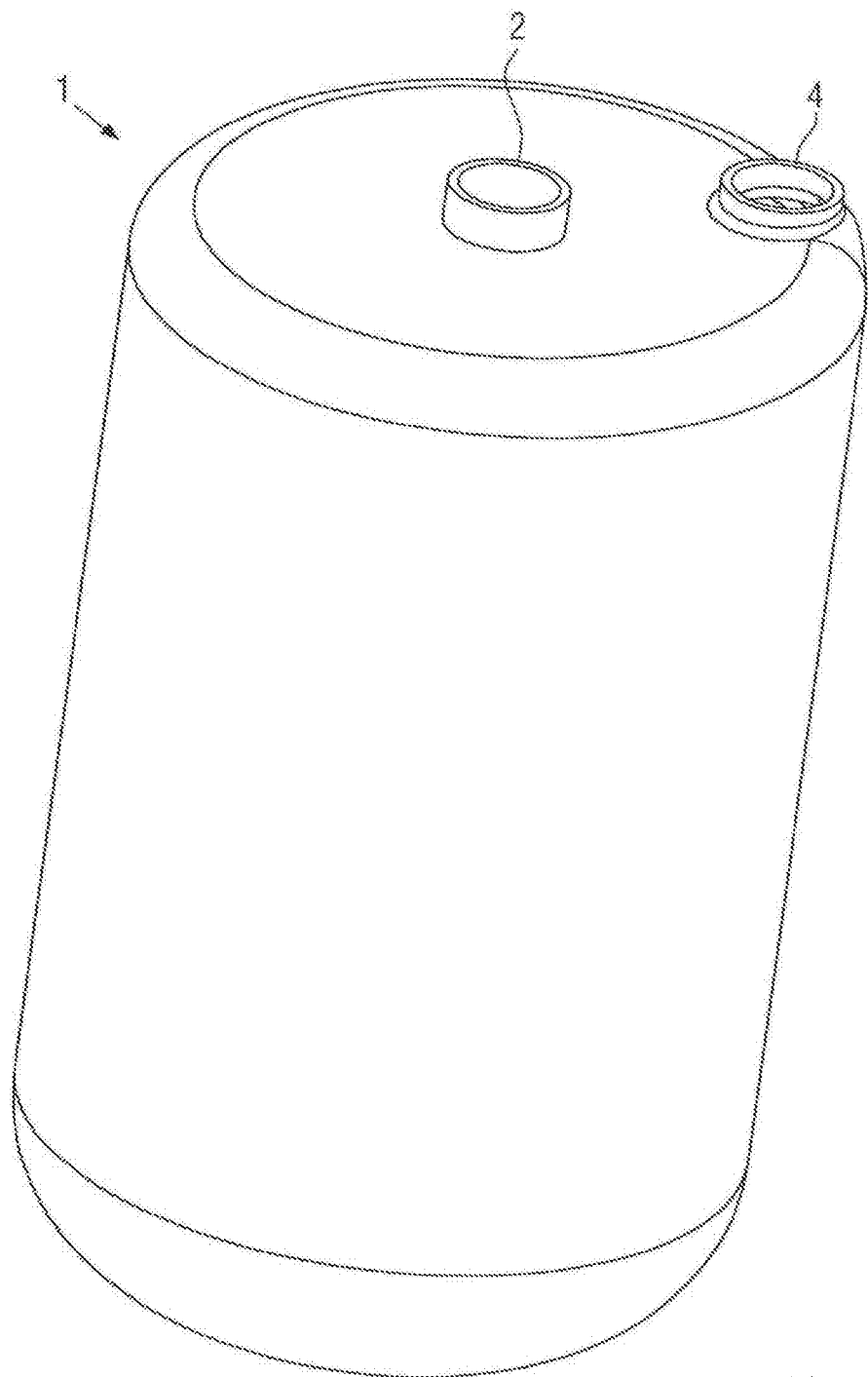
FIG. 1 shows a perspective view of the casing.

The design of the casing for housing electronic components according to the preferred embodiment will now be described with reference to FIGS. 1, 2, and 3 which show a perspective view of the casing and a perspective longitudinal section of the casing, respectively. The casing has a casing wall structure 1 which completely encloses an interior volume 3 of the casing. The casing wall structure 1 comprises an inlet 2 and an outlet 4 for thermal regulation fluid (TRF). The closed casing wall structure 1 has a double-walled structure comprising an inner shell 16 surrounded by an outer shell 14. The inner shell 16 and the outer shell 14 are dimensioned and arranged such that a flow space 6 is formed in between them which is in communication with the inlet 2 and the outlet 4.

The inlet 2 merges into an inner conduit 8 extending through the interior volume 3 of the casing. The casing wall structure has a generally tubular shape with closed end faces 10 and 12. Inlet 2 is located at one end of face 10. The inner conduit 8 extends through the interior volume 3 of the casing wall structure to the inner side of the opposite end face 12 where it merges into the remaining flow space 6 formed between the inner shell 16 and the outer shell 14, where baffles or spacers 15 are provided to connect the inner shell 16 and the outer shell 14, which improve the structural integrity of the casing. In this embodiment, the inner conduit 8 is an extension of the flow space 6 and thus forms a part thereof. In the region where the inner conduit 8 merges into the remaining flow space 6, a central projection 18 is provided. Starting from the central projection 18, the flow paths in the flow space 6 diverge and radially spread in all directions, wherein the central projection 18 supports the diversion of the fluid flow paths from the inner conduit 8 radially outwardly into all directions. It should be noted that the design of the casing wall structure is, except for the outlet 4, rotationally symmetric around a central axis of the inner conduit 8.

The flow paths of the TRF through the flow space 6 will now be described with reference to FIG. 3. FIG. 3 shows in its upper part, a cross-sectional view and in the lower portion, a longitudinal section through the casing. The TRF enters from the inlet 2 into the inner conduit 8, as schematically indicated by the central arrows shown therein. In the cross-section view in the upper portion of FIG. 3, the small circles including crosses indicate rearward ends of arrows, which represent flow direction, and circles including central dots indicate arrow heads. The TRF is flowing along the inner conduit 8 to the opposite end of the casing wall structure where the inner conduit 8 merges into the remaining flow space 6 between the inner shell 16 and the outer shell 14. When the TRF reaches the central projection extending into the end portion of inner conduit 8, the flow paths start to diverge and to spread out uniformly in all directions in a rotationally symmetric manner with respect to the central axis of inner conduit 8. The TRF flows radially outwardly until it reaches the essentially cylindrical portion of the flow space 6. As indicated in the upper portion of FIG. 3, the TRF flow schematically indicated by the arrow heads 3, flows homogeneously distributed around the circumference of the cylindrical portion of the double-walled casing wall structure. Eventually, the TRF flow reaches the flow space between the inner shell and outer shell at end face 10 where the TRF fluid flow starts to converge towards the outlet 4.

Figure 3:
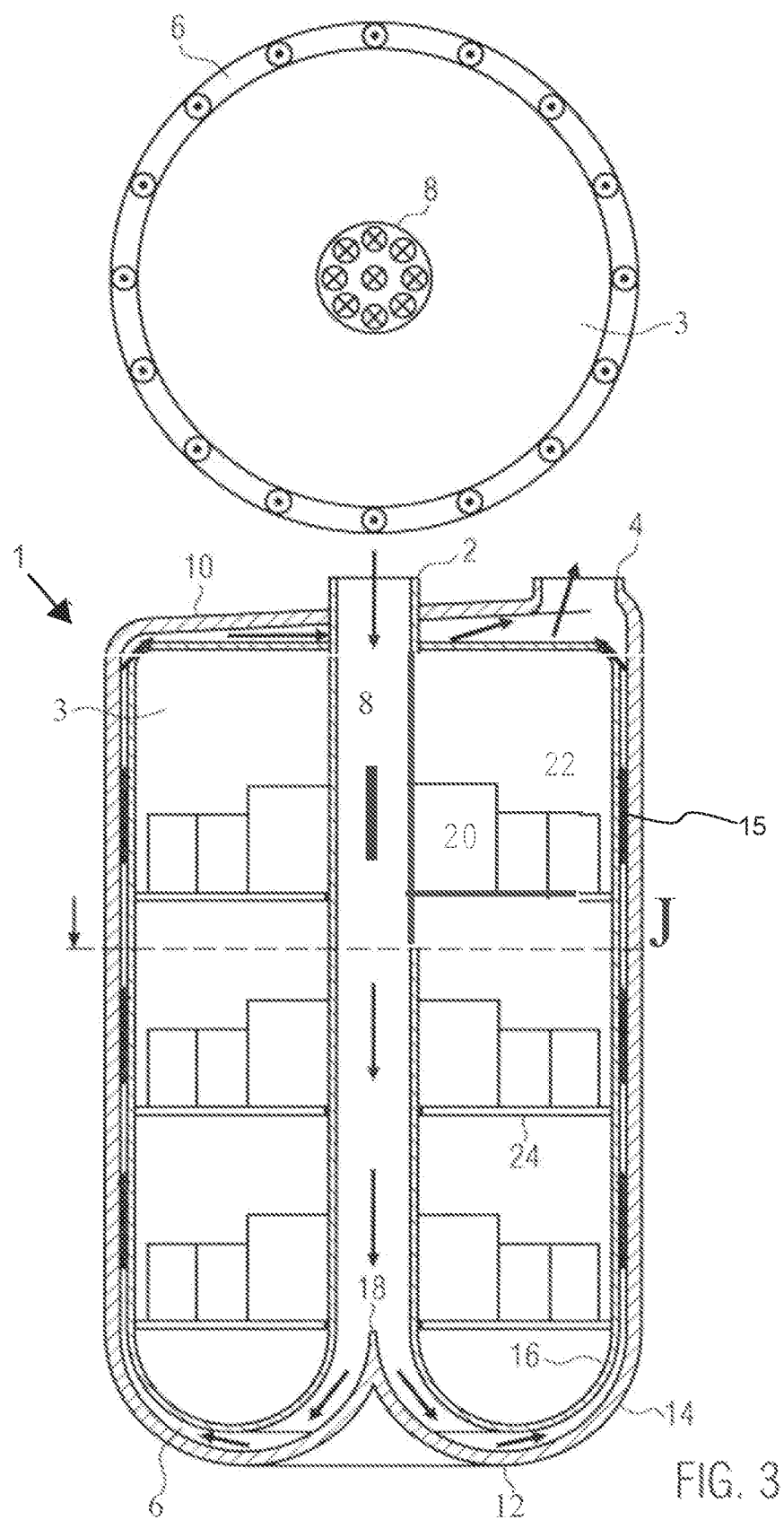
FIG. 3 shows two sectional views, a cross-section and a longitudinal section, to illustrate the flow paths of the thermal regulation fluid through the casing wall structure of the casing.

As depicted in FIG. 3 the interior volume 3 of the casing is completely enclosed by the flow space 6 and by TRF fluid flow. In other words, the interior volume 3 of the casing is enclosed or enveloped by a bubble of TRF flow. This complete enclosure by TRF flow means that from any location within the interior volume 3, one can look in any direction and will look at a wall bordering the interior volume 3, which wall is in contact with TRF flow on its opposite side. This complete enclosure by TRF flow provides for very efficient thermal energy exchange between TRF and electronic components 20 and 22 located in the interior volume 3 of the casing.

Figure 2:
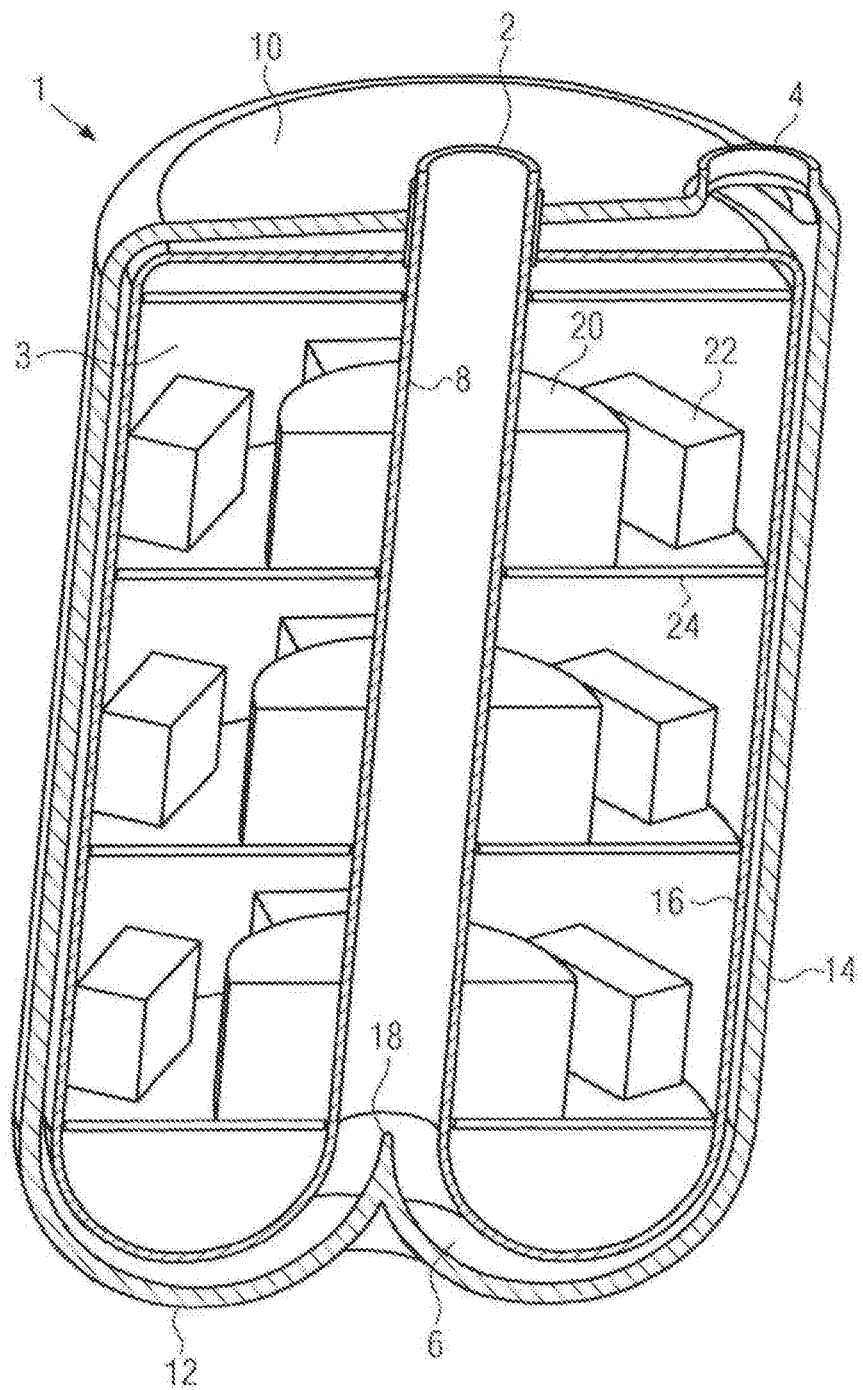
FIG. 2 shows a perspective cross-sectional view of the casing.

In the preferred embodiment shown in FIGS. 2 and 3, electronic components 20 and 22 are mounted on printed circuit boards 24 fixed in the interior volume 3 such that the electronic components 20 are adjacent to an outer wall portion of the inner conduit 8, and that electronic components 22 are located close to the inner surface of inner shell 16, to provide for efficient thermal energy exchange with the adjacent TRF flow.

Figure 4:
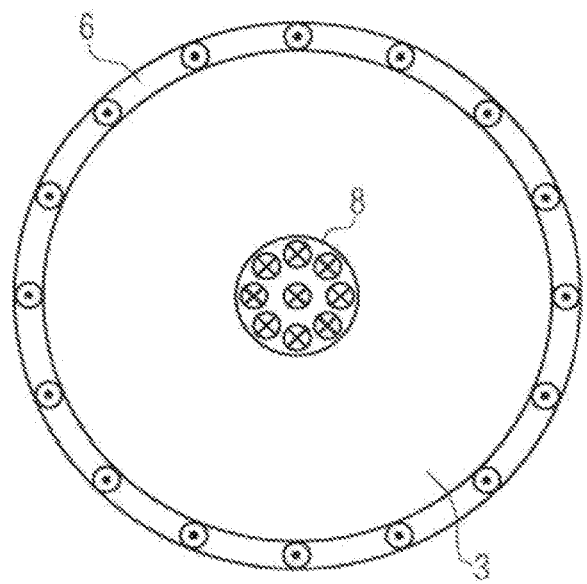
FIGS. 4 to 7 show schematic cross-sectional views of alternative embodiments of the casing.

FIGS. 4 to 7 show schematic cross-sectional views, wherein FIG. 4 corresponds to the cross-section in the upper part of FIG. 3 and FIGS. 5 to 7 show alternative designs of inner conduits traversing the interior volume of the casing. In FIG. 4 there is a single inner conduit from the inlet to the opposite end of the casing where it merges into the remaining flow space of the casing wall structure as described with reference to the embodiment shown in FIGS. 1 to 3.

Figure 5:
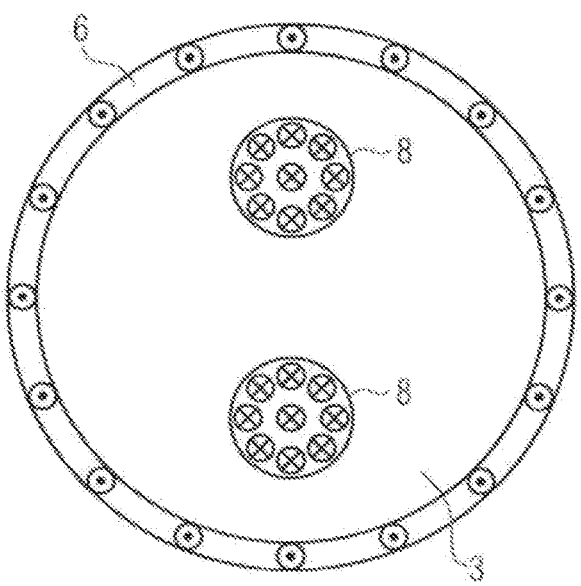

In a first alternative design shown in FIG. 5 there are two inner conduits 8 extending through the internal volume. These two inner conduits 8 may either be two completely separate inner conduits, each having an inlet and each merging into the remaining flow space of the casing wall structure. Alternatively, there may be a single inlet in communication with a first single inner conduit portion which forks into two inner conduits 8 in the internal volume. These two inner conduits 8 may merge again before reaching the opposite end face or may separately merge into the remaining flow space of the casing wall structure.

Figure 6:
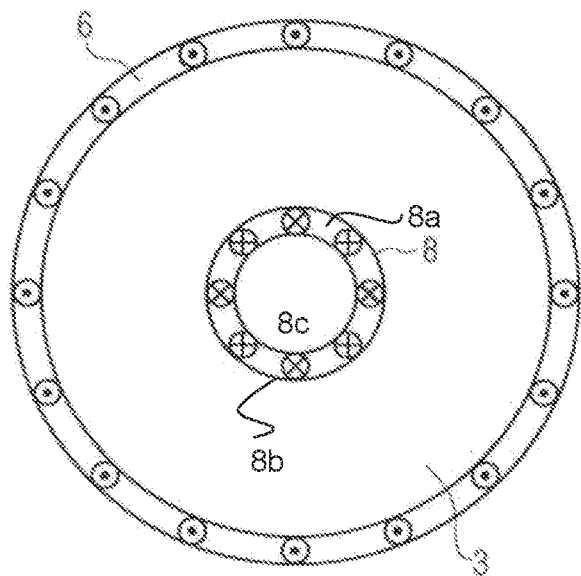

FIG. 6 shows a further alternative design in which the inner conduit 8 is formed with an expanded bulge portion 8a which surrounds a hollow, closed inner conduit shell 8b. This inner conduit shell 8b encloses a conduit shell interior volume 8c which is completely enclosed by a continuous and coherent flow space defined between the expanded bulge portion 8a and the inner conduit shell 8b. In an alternative design the annular flow space of the inner conduit 8 may not be the result of an expanded bulge portion 8a, but the inner conduit 8 is formed as an annular conduit from the inlet over its entire length until it merges into the remaining flow space of the casing wall structure. In the conduit shell interior volume electronic components can be arranged.

Figure 7:
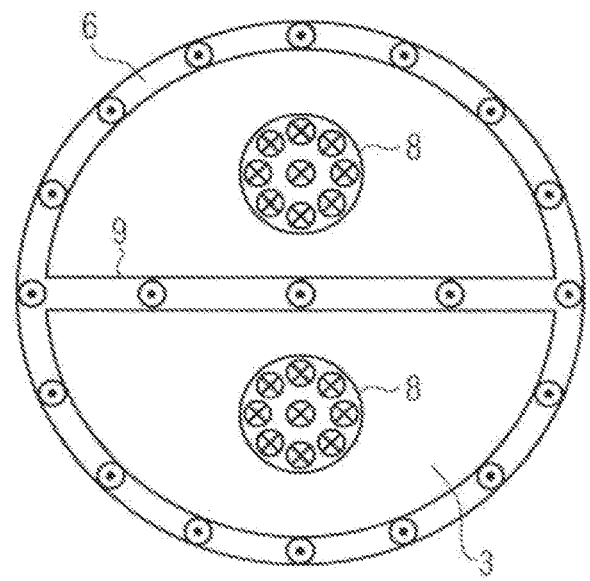

FIG. 7 shows a further variant with two inner conduits 8, and a double-walled internal wall structure 9, the interior of which forms part of the flow space through which TRF returns to the outlet.

The invention claimed is:

1. Casing for housing electronic components, comprising:
a casing wall structure surrounding a casing interior region for accommodating the electronic components, the casing wall structure defining a fluid flow passageway for thermal regulation fluid, the fluid flow passageway extending within the casing wall structure separated from said casing interior region from an inlet to and an outlet at the casing wall structure and including an inner conduit extending through the casing interior region, wherein:
the casing wall structure completely encloses the casing interior region to make it a closed interior volume; and
the casing wall structure is double-walled by including an inner shell and an outer shell which form a space in between in communication with the inlet and the outlet such that between the inner and outer shells the fluid flow passageway is defined as a continuous and coherent flow space which completely encloses the interior volume of the casing wall structure; and
a central projection within the fluid flow passageway, the central projection configured to divert flow path of the inner conduit from the inner conduit radially outward towards the outer shell.

2. Casing for housing electronic components according to claim 1, wherein the casing wall structure has a tubular shape with closed end faces, the inlet is located at one end face and is in communication with an inner conduit extending through the interior volume of the tubular casing wall structure to an inner wall of the opposite end face where it merges into the flow space between the inner and outer shells, and that the outlet is arranged on the same end face as the inlet so that thermal regulation fluid injected through the inlet passes through the inner conduit to the opposite end face and is returned through the flow space to the outlet to exit the outlet on the same end face where it entered the inlet.

3. Casing for housing electronic components according to claim 2, wherein the inner conduit branches out in the interior volume into at least two inner conduits which merge before merging into the flow space or individually merge into the flow space of the casing wall structure.

4. Casing for housing electronic components according to claim 2, wherein an inner conduit is provided with an expanded bulge portion which surrounds a closed inner conduit shell which encloses a conduit shell interior volume which is completely enclosed by a continuous and coherent flow space defined between the expanded bulge portion and the inner conduit shell.

5. Casing for housing electronic components according to claim 2, wherein at least one printed circuit board is mounted in the interior volume and is arranged such that electronic components mounted thereon are arranged in the vicinity of the innermost shell bordering the interior volume or in the vicinity of the inner conduit.

6. Casing for housing electronic components according to claim 1, wherein the casing wall structure comprises several casing wall structure components that are connected to each other and which enclose the interior volume in an airtight manner.

7. Casing for housing electronic components according to claim 6, wherein the casing wall structure comprises several casing wall structure components made of plastics, metal, composites or any combination thereof.

8. Casing for housing electronic components according to claim 7, wherein the casing wall structure components are made of thermally conductive plastics having thermal conductivity of at least 1 W/mK.

9. Casing for housing electronic components according to claim 2, wherein the inlet and the outlet form a concentric arrangement with a central port forming the inlet and a surrounding annular port forming the outlet.

10. Casing for housing electronic components according to claim 1, wherein the casing wall structure includes a passage extending therethrough for receiving electric cables leading to the interior volume and to the electronic components therein.

11. Casing for housing electronic components according to claim 1, wherein a spacer is provided which connects the inner and outer shells of the casing wall structure.

12. Casing for housing electronic components according to claim 1, wherein the casing wall structure is configured to provide electromagnetic shielding for the interior volume enclosed therein.

\* \* \* \* \*